(12) United States Patent
Furusawa

(10) Patent No.: US 7,631,651 B2
(45) Date of Patent: Dec. 15, 2009

(54) CLEANING METHOD OF SEMICONDUCTOR MANUFACTURING APPARATUS AND SEMICONDUCTOR MANUFACTURING APPARATUS

(75) Inventor: Takayuki Furusawa, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 384 days.

(21) Appl. No.: 11/469,724

(22) Filed: Sep. 1, 2006

(65) Prior Publication Data

US 2007/0074738 A1 Apr. 5, 2007

(30) Foreign Application Priority Data

Sep. 5, 2005 (JP) ............................. 2005-256804

(51) Int. Cl.
*B08B 9/00* (2006.01)
(52) U.S. Cl. .................... 134/22.1; 134/26; 134/30; 134/36
(58) Field of Classification Search ............. None
See application file for complete search history.

(56) References Cited

U.S. PATENT DOCUMENTS 5,129,958 A * 7/1992 Nagashima et al. ........ 134/22.1

6,974,781 B2 * 12/2005 Timmermans et al. ...... 438/794
2006/0144234 A1 * 7/2006 Komatsu ..................... 95/288

FOREIGN PATENT DOCUMENTS

| JP | 6-252063 | 9/1994 |
|---|---|---|
| JP | 8-172083 | 7/1996 |
| JP | 11-54485 | 2/1999 |

* cited by examiner

*Primary Examiner*—Duy-Vu N Deo
(74) *Attorney, Agent, or Firm*—Oblon, Spivak, McClelland, Maier & Neustadt, L.L.P.

(57) ABSTRACT

A cleaning method of a semiconductor manufacturing apparatus begins by introducing film forming gas include reaction gas not forming a film by itself to reaction chamber to form the film on a semiconductor substrate, decreasing pressure of the reaction chamber, solidifying or liquefying the reaction gas to form particles by using small-particles in the reaction chamber as cores, and exhausting the particles from the reaction chamber. Using this method, foreign small-particles can easily be removed from the apparatus and suppress any possible contamination of semiconductor substrates to be processed.

14 Claims, 2 Drawing Sheets

CLEANING METHOD OF SEMICONDUCTOR MANUFACTURING APPARATUS AND SEMICONDUCTOR MANUFACTURING APPARATUS

CROSS-REFERENCE TO RELATED APPLICATIONS

This application is based upon and claims the benefit of priority from the prior Japanese Patent Applications No. 2005-256804 filed on Sep. 5, 2005, the entire contents of which are incorporated herein by reference.

BACKGROUND OF THE INVENTION

1. Field of the Invention

The present invention relates a cleaning method of semiconductor manufacturing apparatus and semiconductor manufacturing apparatus such as film forming apparatus.

2. Description of the Related Art

Film forming apparatuses such as low pressure CVD (chemical vapor deposition) apparatuses are typically used for forming films on semiconductor substrates in the manufacturing process of semiconductors.

FIG. 1 shows a schematic cross sectional view of a low pressure CVD apparatus. According to FIG. 4, the apparatus comprises a reaction tube 103 including an inner tube 103a and an outer tube 103b where a boat 102 carrying a plurality of semiconductor substrates 101 to be processed is mounted and a closure 104 for sealing the reaction tube. The reaction tube 103 is connected to a reaction gas feed pipe 105, which is included in a supply system, also connected to a vacuum pump 106, which is included in an exhaust system, through a gate valve 107. A heater 108 is arranged around the reaction tube to heat reaction gas.

Part of excessive gas not participating in the film forming accumulates as reaction byproducts 109 near the closure 104 at an end of the reaction tube 103. As the film forming process is repeated, the amount of the adhering and accumulating reaction byproducts 109 increases. Then, part of the reaction byproducts 109 come off, to float in air and contaminate the semiconductor substrates to be processed so that they usually removed by cleaning gas. However, it has been difficult to effectively remove floating small-particles (foreign-material) 110 that are not moved away on the exhaust gas flow.

Meanwhile, as a method for cleaning small-particles in an etching apparatus, it is suggested that introducing steam under reduced pressure using the small-particles as cores for solidification/liquefaction to make small-particles removable (see, for example, Jpn. Pat. Publication No. 11-54485). However, it has been difficult to apply any of the method to the film forming apparatus, because an injection channel has to be additionally provided to inject a foreign object such as steam into the film forming apparatus, and a tiny amount of the injected foreign object is remaining in the apparatus, it can adversely affect the film forming process and contaminate the semiconductor substrates to be processed.

BRIEF SUMMARY OF THE INVENTION

Cleaning method of semiconductor manufacturing apparatus according to an embodiment of present invention begins by introducing film forming gas include reaction gas not forming a film by itself to reaction chamber to form the film on a semiconductor substrate, decreasing pressure of the reaction chamber, solidifying or liquefying the reaction gas to form particles by using small-particles in the reaction chamber as cores, and exhausting the particles from the reaction chamber.

Semiconductor manufacturing apparatus according to an embodiment of present invention includes a reaction chamber for introducing film forming gas include reaction gas not forming a film by itself, the film forming gas forming the film on a semiconductor substrate, a supply system for introducing the film forming gas to the reaction chamber, and an exhaust system for decreasing pressure of the reaction chamber to solidify or liquefy the reaction gas to form particles by using small-particles in the reaction chamber as cores and exhausting the particles from the reaction chamber.

DETAILED DESCRIPTION OF THE PREFERRED EMBODIMENTS

Hereinafter, the embodiment relating to the present invention will be described in greater detail by referring to FIGS. 2 through 4.

Figure 1:
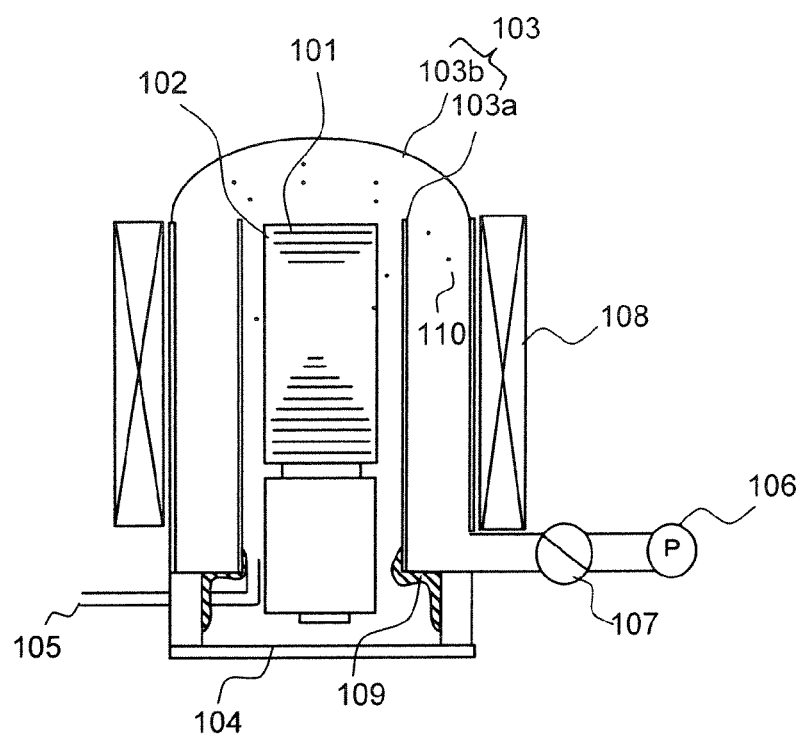
FIG. 1 is a cross sectional view showing a low pressure CVD apparatus of prior art.
Figure 2:
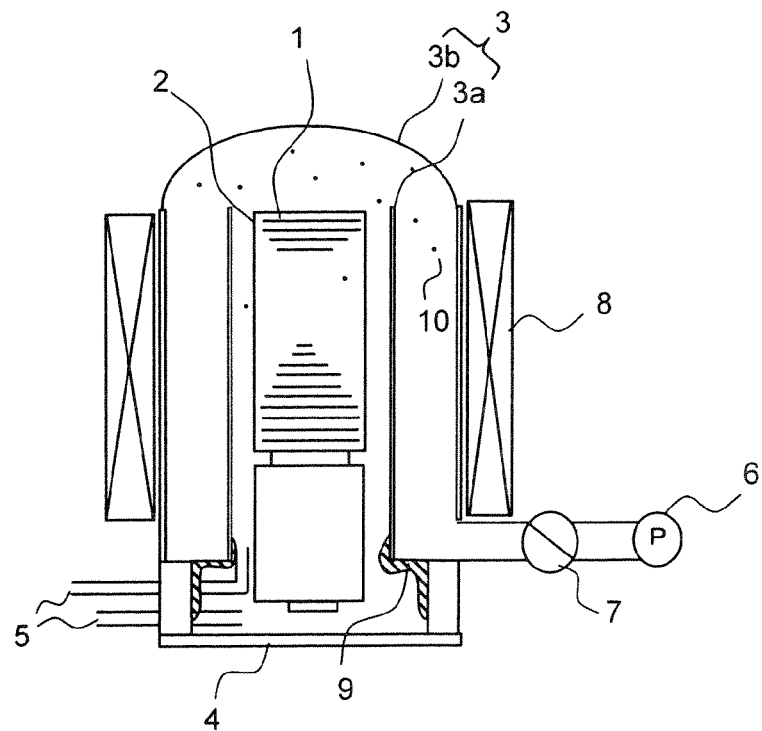
FIG. 2 is a cross sectional view showing a low pressure CVD apparatus of an embodiment of the present invention.
Figure 3:
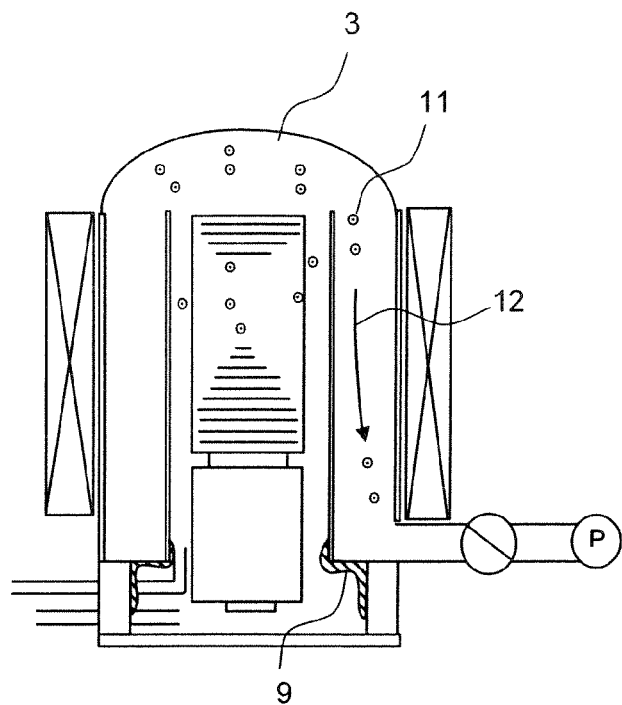
FIG. 3 is a cross sectional view showing a low pressure CVD apparatus of FIG. 2 in the cleaning process of the embodiment of the present invention.

FIG. 2 shows a schematic cross sectional view of the low pressure CVD apparatus as a semiconductor manufacturing apparatus of this embodiment. According to FIG. 2, the apparatus comprises a reaction tube (reaction chamber) 3 including an inner tube 3a and an outer tube 3b where a boat 2 carrying a plurality of semiconductor substrates to be processed is mounted and a closure 4 for sealing the reaction tube. The reaction tube 3 is connected to a reaction gas feed pipe 5, which is included in a supply system, also connected to a vacuum pump 6, which is included in an exhaust system, through a gate valve 7. A heater 8 is arranged around the reaction tube to heat reaction gas.

In the low pressure CVD apparatus having the above-described configuration, films such as SiN films are formed the same as in the prior art on the semiconductor substrates 1 such as 200 mm diameter Si substrates. In the film forming process, firstly semiconductor substrates 1 are loaded on a boat 2 and put into the reaction tube 3. Then, the gate valve 7 is opened and the internal pressure of the reaction tube 3 is reduced to a desired pressure level by means of the vacuum pump 6. Subsequently the film forming gas containing silane gas and $NH_3$ gas is introduced into the reaction tube 3 by way of the reaction gas feed pipe 5. Then, the gas of each type is heated and thermally decomposed in the reaction tube 3 by the heater 8 to form the films such as SiN films 200 nm thickness of on the semiconductor substrates 1. After the film forming operation, the boat 2 is moved out of the reaction tube 3 and a boat 2 that carries mint semiconductor substrates 1 to be processed is brought in. The above process will be repeated.

Part of excessive gas not participating in the film forming accumulates as reaction byproducts 9 such as $Si_xN_yH_z$ that does not compositionally agree with $Si_3N_4$ near the closure 4 at an end of the reaction tube 3 that is cooled to a relatively low temperature level. Then, part of the reaction byproducts 9 float in the inside of the reaction tube 3 as small-particles 10.

The reaction byproducts 9 are produced and the small-particles 10 are floating in the low pressure CVD apparatus, the boat 2 loading semiconductor substrates to be processed is moved out of the reaction tube 3, being sealed by the closure 4. Then, the gate valve 7 is opened, the internal gas of the reaction tube 3 is exhausted to decrease the pressure to 1.3 Pa, for example, by the vacuum pump 6. Thereafter, $NH_3$ gas, which is reaction gas not forming a film by itself, is introduced into the reaction tube 3 by way of the reaction gas feed pipe 5 at a flow rate such as 3,500 sccm for 30 seconds. The introduced $NH_3$ gas is cooled in the reaction tube 3 as it gives rise to adiabatic expansion and becomes solidified or liquefied and grows, using floating small-particles that are a part of the reaction byproducts 9 as cores, to form particles 11 as shown. The particles 11 that are formed in this way no longer float in the reaction tube 3 because of an increase of the specific gravity and are discharged from the reaction tube 3 with the exhaust gas flow 12.

Figure 4:
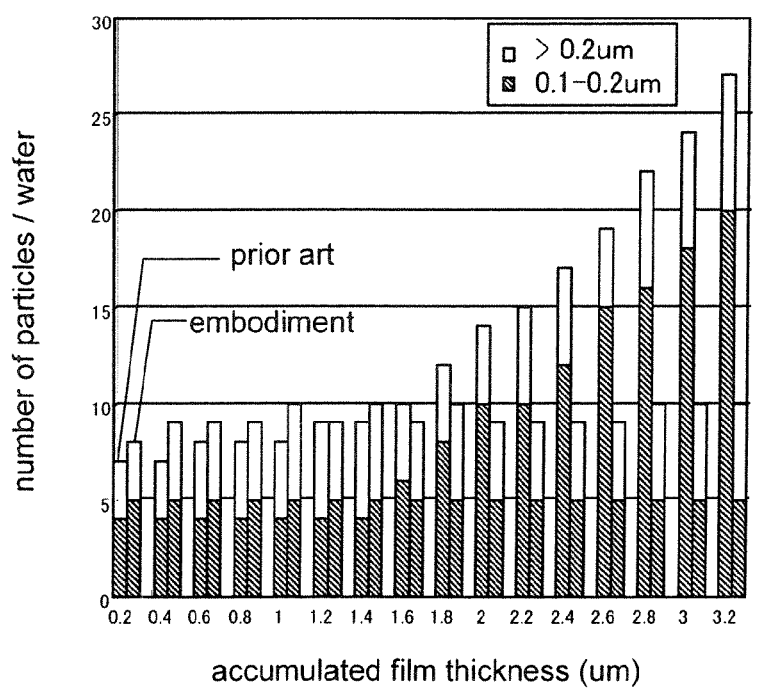
FIG. 4 is a graph illustrating a number of particles on a surface of a semiconductor substrate relative to an accumulated film thickness of the embodiment of the present invention.

FIG. 4 shows relation of a number of particles on the surface of a semiconductor substrate to an accumulated film thickness in this embodiment after removing small-particles. The number of 'particles' larger than 0.2 μm and the number of 'small-particles' 0.1 to 0.2 μm were counted separately. For the purpose of comparison, a number of particles of the prior art that is not adapted to remove small-particles is also shown in FIG. 4.

As shown in FIG. 4, the number of the small-particles rapidly increases when the accumulated film thickness exceeds 1.6 μm with the prior art, but the increase in the number of the small-particles is suppressed according to this embodiment because they are mostly removed. Thus, this embodiment can suppress the adhesion of small-particles to the surfaces of semiconductor substrates.

In this embodiment, the $NH_3$ gas as reaction gas is introduced as a source of N for SiN films to form particles by using small-particles as cores. The $NH_3$ gas is advantageously because of its high liquefying temperature and easy solidified or liquefied growth by adiabatic expansion. However, the reaction gas to form particles is not limited to $NH_3$ gas and any other gas can alternatively be used so long as the reaction gas that does not form films by itself. For example, $PH_3$ gas and $B_2H_6$ gas using to for dope impurities can be used. Furthermore, $N_2O$ gas and $O_2$ gas as sources of O for forming a SiOC film and HCl gas as reaction gas to be used with monomethyl silane for forming a SiC film.

This embodiment is applied to a low pressure CVD apparatus, also be applied to some other film forming apparatuses such as a plasma CVD apparatus.

The inside of the reaction tube is preferably subjected to a preliminary cleaning operation using cleaning gas as in the case of the prior art to remove the reaction byproducts adhering to the inside of the reaction tube to a certain extent before removing foreign small-particles in order to improve the effect. Fluorine type gas normally used as cleaning gas can also be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of cleaning a semiconductor manufacturing apparatus, the method comprising:
   introducing a film forming gas to a reaction chamber to form a film on a semiconductor substrate, the film forming gas comprising a reaction gas, the reaction gas not being able to form a film by itself; then
   introducing more reaction gas into the reaction chamber;
   decreasing the pressure of the reaction chamber to solidify or liquefy the reaction gas and to thereby form particles of said reaction gas using small-particles present in the reaction chamber as cores therefor; and
   exhausting the particles from the reaction chamber.

2. The method according to claim 1, wherein the reaction gas is a source gas of nitrogen or oxygen included in the film.

3. The method according to claim 2, wherein the reaction gas is NH3 gas.

4. The method according to claim 3, wherein the film formed on the semiconductor substrate is a SiN film.

5. The method according to claim 1, wherein the film forming gas includes silane gas.

6. The method according to claim 1, further comprising first cleaning in the reaction chamber using cleaning gas.

7. The method according to claim 6, wherein the cleaning gas is Fluorine type gas.

8. The method according to claim 1, wherein the small-particles are reaction byproducts of film forming.

9. The method according to claim 8, wherein the small-particles are made of a part of the reaction byproducts accumulated inside of the reaction chamber and floating in the reaction chamber.

10. The method according to claim 1, wherein a size of the small-particles is 0.1 to 0.2 μm.

11. The method according to claim 1, wherein the reaction gas is solidified or liquefied by adiabatic expansion.

12. The method according to claim 1, wherein the semiconductor manufacturing apparatus is a low pressure CVD apparatus.

13. The method according to claim 1, wherein the semiconductor manufacturing apparatus is a plasma CVD apparatus.

14. The method according to claim 1, wherein the reaction gas is source gas of impurities included in the film.

* * * * *